United States Patent [19]

Togashi et al.

[11] Patent Number: 4,502,204

[45] Date of Patent: Mar. 5, 1985

[54] METHOD OF MANUFACTURING INSULATED GATE THIN FILM FIELD EFFECT TRANSISTORS

[75] Inventors: Seigo Togashi; Kanetaka Sekiguchi, both of Tokorozawa, Japan

[73] Assignee: Citizen Watch Company Limited, Tokyo, Japan

[21] Appl. No.: 621,324

[22] Filed: Jun. 15, 1984

Related U.S. Application Data

[63] Continuation-in-part of Ser. No. 398,126, Jul. 14, 1982, abandoned.

[30] Foreign Application Priority Data

Jul. 17, 1981 [JP] Japan .................................. 56-112025
Aug. 25, 1981 [JP] Japan .................................. 56-132860
Dec. 22, 1981 [JP] Japan .................................. 56-207736

[51] Int. Cl.³ .......................................... H01L 21/203
[52] U.S. Cl. .......................................... 29/571; 29/578; 29/584; 29/591; 204/15; 204/42; 204/56 R; 204/164
[58] Field of Search ................. 29/571, 578, 584, 591; 204/42, 15, 56 R, 164

[56] References Cited

U.S. PATENT DOCUMENTS

| | | | |
|---|---|---|---|
| 3,258,663 | 6/1966 | Weimer | 357/4 |
| 3,391,035 | 7/1968 | Mackintosh | 148/187 |
| 3,520,051 | 7/1970 | Topfer et al. | 29/585 X |
| 3,568,305 | 3/1971 | Janning | 29/589 X |
| 3,616,527 | 11/1971 | Janning | 148/174 X |
| 3,699,011 | 10/1972 | Nishimura | 29/571 X |
| 3,798,752 | 3/1974 | Fujimoto | 29/578 X |
| 4,332,075 | 1/1982 | Ota et al. | 357/4 X |
| 4,372,032 | 2/1983 | Collins et al. | 29/591 X |

Primary Examiner—G. Ozaki
Attorney, Agent, or Firm—Jordan and Hamburg

[57] ABSTRACT

A method of manufacturing insulated gate thin film field effect transistors is disclosed in which first and second closely adjacent anodic oxidation electrodes are formed on an electrically insulating substrate, and a semiconducting layer is formed on the insulating substrate and the first and second anodic oxidation electrodes. An anodic oxidation of the semiconducting layer is performed, utilizing the first and second anodic oxidation electrodes, to form an oxide layer on the semiconducting layer. The oxide layer is then patterned to form a gate insulator and the semiconducting layer is patterned to expose a portion of each of the first and second anodic oxidation electrodes. The exposed portions of the first and second anodic oxidation electrodes are patterned to form source and drain electrodes, respectively.

4 Claims, 24 Drawing Figures

Fig. 2
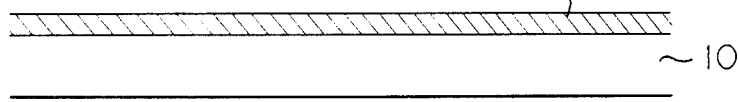
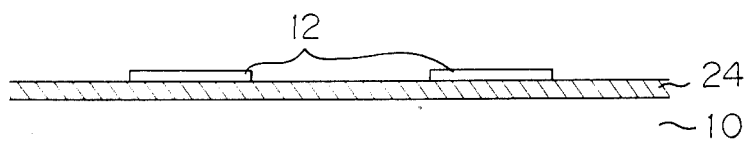
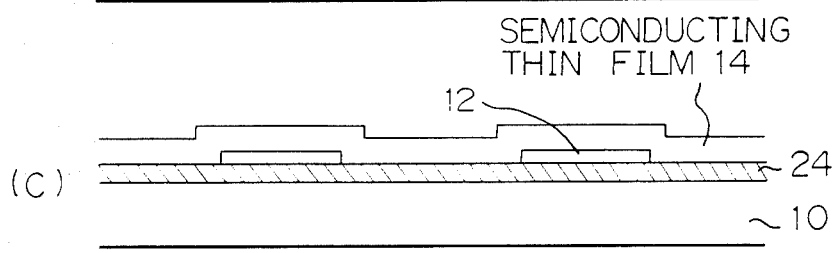
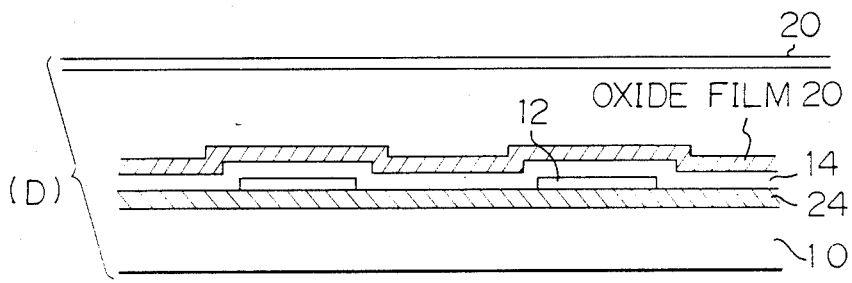
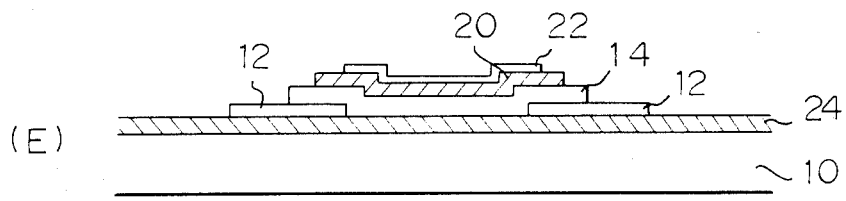

Fig. 5

(A)
SEMICONDUCTING THIN FILM 40

SUBSTRATE 10

(B)
40  43
CONDUCTING FILM 42

(C)
32
OXIDE FILM 44
CATHODE ELECTRODE 21
40
42
10

(D)
SOURCE ELECTRODE 48
GATE ELECTRODE LAYER 46
DRAIN ELECTRODE 50
42  44  42
10

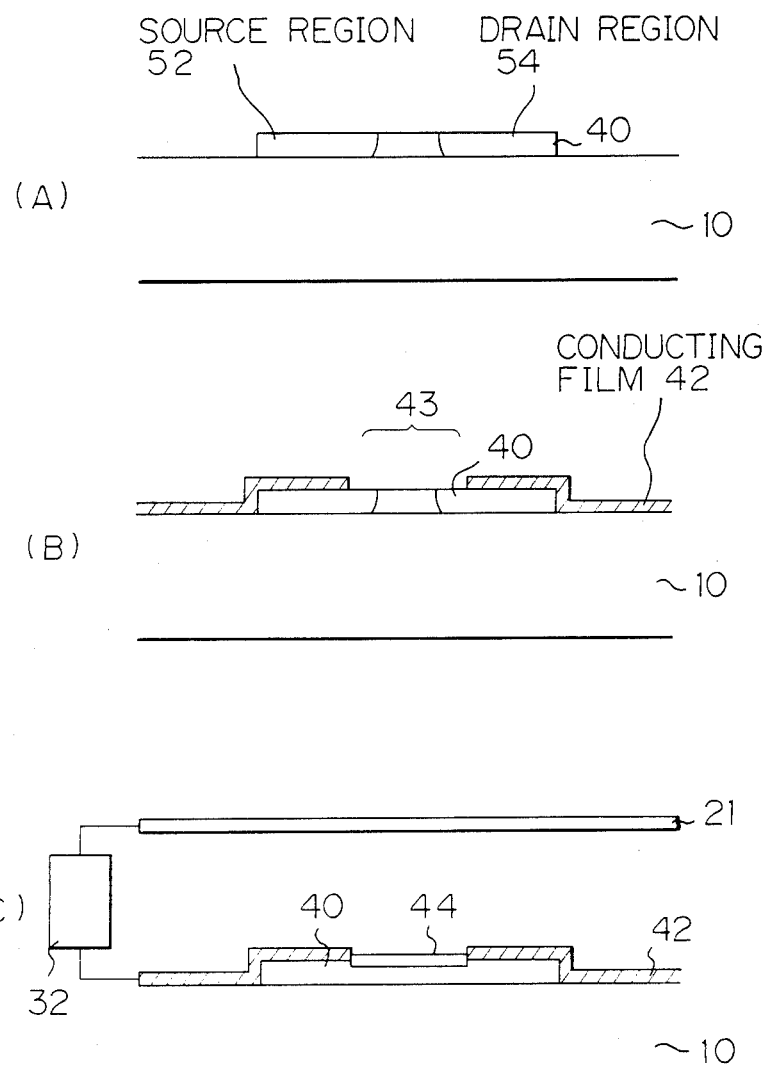

METHOD OF MANUFACTURING INSULATED GATE THIN FILM FIELD EFFECT TRANSISTORS

This is a continuation-in-part of patent application Ser. No. 398,126 filed July 14, 1982, and now abandoned.

BACKGROUND OF THE INVENTION

The present invention relates to a method of manufacturing insulated gate thin film field effect transistors (referred to hereinafter simply as thin film transistors), whereby a number of thin film transistors may be formed simultaneously upon a substrate which can be selected from a wide range of materials, including glass.

At the present time, there is an increasing requirement for display devices having a high density of display elements, which can be manufactured as economically as possible. The majority of such display devices used in miniature electronic devices, such as electronic wristwatches, are of the liquid crystal type, and the highest display density is obtainable by using a matrix display configuration, in which an individual switching element is provided for each display element, these switching elements being positioned at the intersections of row and column electrodes and controlled by drive signals applied thereto, with the switching elements generally comprising insulated gate thin film field effect transistors. The performance and reliability of such a display is greatly affected by the electrical characteristics, such as switching speed etc, of these thin film transistors. It is desirable that these thin film transistors be formed upon a transparent substrate in such a display device, and in the case of a display device of transmission type (i.e. in which light is transmitted through the display device from the rear toward the viewer), such as might be used in a television display using such a device, it is essential that the thin film transistors be formed on a transparent substrate, for example one of the substrates of a liquid crystal display. The semiconductor thin film used in such thin film transistors generally comprises a film of polycrystalline silicon, deposited on a substrate by, for example, chemical vapor deposition. Such a semiconductor film has a very high electrical resistivity. In the prior art, it has been possible to form thin films of oxide, for use as the gate insulating layer of field effect transistors upon a base layer which has fairly high electrical conductivity, such as a layer of bulk semiconductor. An oxide film formed upon such a base layer can be made extremely uniform, by deposition using the anodic oxidation process. However it has not hitherto been possible to use anodic oxidation to form an oxide film for use as the gate insulating layer of thin film field effect transistors upon a base layer having high resistivity, such as a thin semiconductor film. In the prior art, the only method which has been available for forming the gate insulating layer of such thin film transistors has been to either perform thermal oxidation of the polycrystalline silicon film at an extremely high temperature, to form a film of $SiO_2$, or to form a film of an insulating material such as $Al_2O_3$, by a method such as chemical vapor deposition or physical vapor deposition. The thermal oxidation method provides an oxide film which is extremely uniform in thickness and free from internal defects. As a result, the thin film transistors produced by such a method can have excellent switching and other electrical characteristics. However, as a result of the high temperature processing required to form the oxide film for use as a gate insulating layer of the thin film transistors, only a very limited range of materials are available for use as the substrate for such transistors, and it is not possible to use an inexpensive transparent material such as glass. If deposition of a gate insulating layer by chemical or physical vapor deposition is performed, then the processing temperature is not excessive, so that it is possible to use a substrate material which is not capable of withstanding high temperatures, such as glass. However the gate insulating layer which is formed by such a method is greatly inferior to the oxide film produced by the thermal oxidation method, so that it is not possible to produce thin film transistors having good electrical characteristics by such a prior art method.

As described hereinafter, the method of manufacturing thin film transistors according to the present invention overcomes the disadvantages of prior art methods, as described above, and enables a number of thin film transistors having excellent electrical characteristics to be formed upon a substrate which may consist of an inexpensive transparent material such as glass, so that the present invention is highly suitable for manufacture of thin film transistors for use as switching elements in a high-density matrix display device.

SUMMARY OF THE INVENTION

With the method of the present invention, a semiconductor thin film and a patterned conducting film are formed together upon an insulating substrate, such as to be in close electrical contact with one another. The patterned conducting film may be patterned in such a form as to be subsequently usable as source and drain electrodes of the thin film transistors which are finally produced, or can be a layer which is removed before completion of the manufacturing process. The semiconductor thin film and the patterned conducting film are then subjected to anodic oxidation, using the patterned conducting film as an anode electrode in this process. An extremely uniform and high quality oxide film is thereby formed over the semiconductor thin film (i.e. a film of $SiO_2$ if the semiconductor thin film consists of Si). Thereafter, a conducting layer is formed over the oxide film, and patterned by a process such as etching to serve as a gate electrode, with the oxide film serving as the gate insulating layer. It should be noted that although the term "semiconductor thin film" has been used above, the present invention is also applicable to the formation of new types of thin film transistors in which some non-insulating material other than a conventional semiconductor is utilized.

The anodic oxidation process can be performed either in the gaseous phase (i.e. in an oxygen plasma) or in the liquid phase, using a suitable electrolyte.

BRIEF DESCRIPTION OF THE DRAWINGS

FIGS. 1(A)–(E) and FIGS. 2(A)–(E) are diagrams for illustrating the steps of a first and a second embodiment respectively of the manufacturing method of the present invention;

FIGS. 4(A)–(D), FIGS. 5(A)–(D) and FIGS. 6(A)–(E) are diagrams for illustrating the steps of a third, fourth and fifth embodiment respectively of the manufacturing method of the present invention.

DESCRIPTION OF THE PREFERRED EMBODIMENTS

Figure 1:
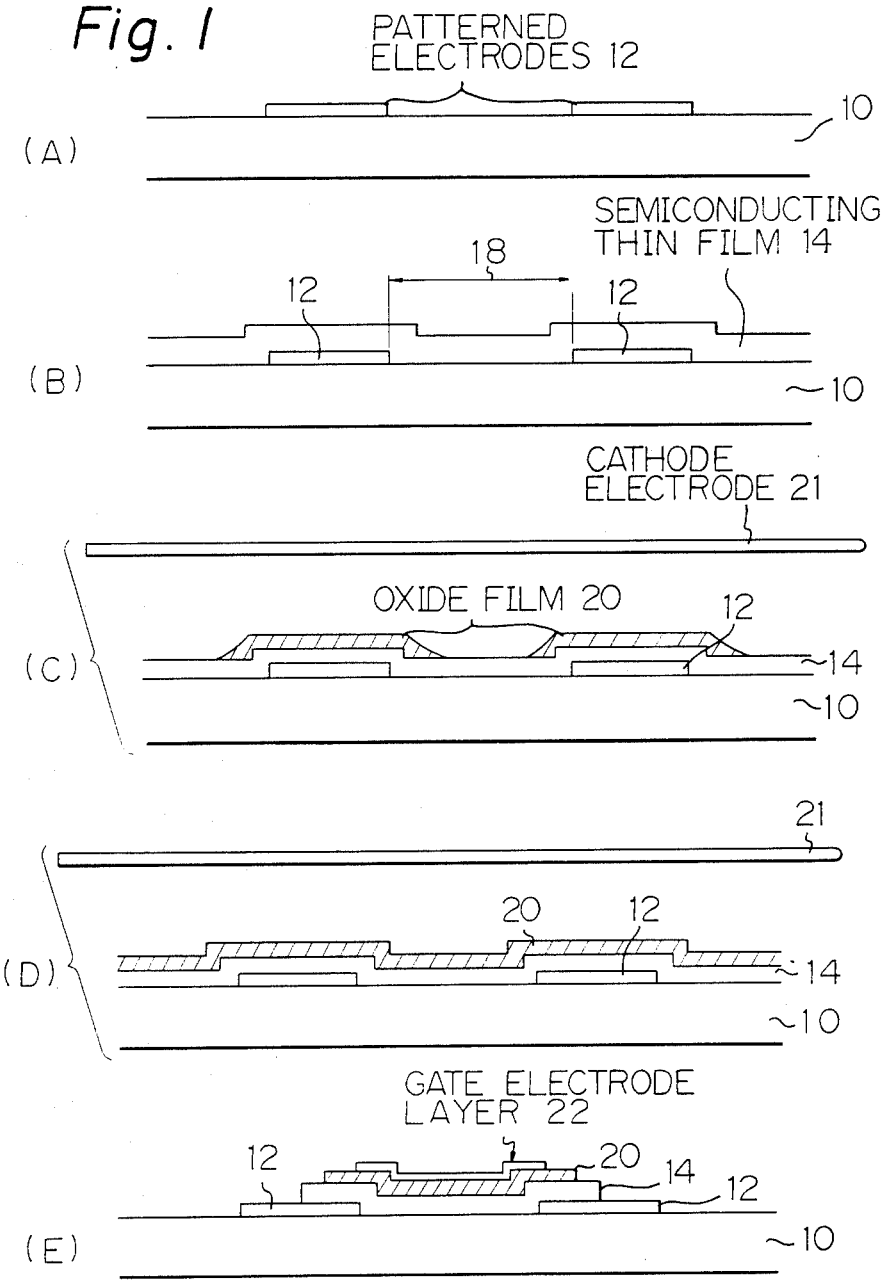

FIG. 1 is a diagram for illustrating the essential steps in a first embodiment of a method of manufacturing thin film transistors according to the present invention. In the initial step of FIG. 1(A), a pair of closely adjacent patterned electrodes 12 are formed on an insulating substrate 10. It should be noted here that the following description of the present embodiment, and also subsequent descriptions of other embodiments of the present invention, will refer only to the manufacture of a single thin film transistor. However this is only for convenience of description, and it should be understood that in general a plurality of thin film transistors will be formed simultaneously upon substrate 10 in the manner described for a single thin film transistor. Thus in general a plurality of pairs of patterned electrodes 12, which may be in the form of narrow parallel stripes, will be formed on substrate 10 in the initial step of FIG. 1(A).

The insulating substrate 10 may comprise, for example, a sheet of quartz glass or pyrex glass, i.e. materials which cannot withstand extremely high temperatures, since as described herinafter all of the subsequent processing steps are carried out at comparatively low temperatures, e.g. less than 500° C. The patterned electrodes 12 can consist of a metal such as Mo or Ta.

In the next step, shown in FIG. 1(B), a non-insulating thin film is formed over the patterned electrodes 12 and the remaining areas of substrate 10. In this embodiment, the non-insulating thin film comprises a thin film 14 of a semiconductor such as Si. However it should be understood that the method of the present invention is equally applicable to the use of other types of non-insulating thin film than conventional semiconductor materials.

In the step of FIG. 1(C), the semiconductor thin film 14 is subjected to anodic oxidation, to form a film of oxide (i.e. $SiO_2$) upon the surface thereof. This anodic oxidation can be carried out either in the gaseous phase (e.g. in an oxygen plasma) or in the liquid phase using a suitable electrolyte. Anodic oxidation by liquid phase is performed at a temperature of about 10 to 50° C. with the current density being controlled in a range 0.01 to 1 $A/cm^2$. Anodic oxidation by oxgen plasma is performed at a temperature of about 200 to 400° C., with the plasma being controlled in a range 0.1 to 5 watts/$cm^2$. It is a basic and novel feature of the method of the present invention that the patterned electrodes 12 are connected in common to a power source and used as an anode electrode in this anodic oxidation process, being used in conjunction with a cathode electrode 21.

In the initial stages of the anodic oxidation process, the oxide film 20 will be formed mainly over those areas of the semiconductor thin film 14 surface which are closest to the patterned electrodes 12, due to the low conductivity of the semiconductor thin film 14, while areas which are more distant from the patterned electrodes 12 will be comparatively unaffected. However, as those areas of semiconductor thin film which are closest to the patterned electrodes 12 become covered with oxide film 20 (which of course has a very low electrical conductance), current will increasingly flow through semiconductor thin film 14 to regions of thereof which are farther away from the patterned electrodes 12. As a result of this, and also due to the fact that the patterned electrodes 12 are spaced closely adacent, by a narrow spacing denoted by numeral 18 in FIG. 1(B), the anodic oxidation will eventually produce a very uniform thickness of oxide film 20 over the semiconductor thin film 14.

In the final steps of the manufacturing process, as illustrated in FIG. 1(E), a gate electrode layer 22 consisting of a layer of a conducting material is formed over the oxide film 20, and then patterning of the gate electrode layer 22, oxide film 20, and semiconductor thin film 14 is carried out to remove unnecessary portions of these layers. This patterning can be carried out, for example, by an etching process. An insulated gate thin film transistor is thereby formed, in which portions of patterned electrodes 12 constitute the source and drain electrodes, and in which a portion of oxide film 20, formed by anodic oxidation as described above, constitutes the gate insulating layer.

Referring now to FIG. 2, a second embodiment of a method of manufacturing thin film transistors according to the present invention is shown. This embodiment is almost identical to that described above, with the only important point of difference being that an impurity trap layer 24 is formed as a preparatory step, over the surface of substrate 10, as shown in FIG. 2(A). The patterned electrodes 12, which can comprise closely adjacent narrow stripe electrodes as in the first embodiment, are then formed over the impurity trap layer 24. The subsequent steps in the manufacturing process, illustrated by FIG. 2(C), 2(D) and 2(E), can be identical to those of FIG. 1(B), 1(D), and 1(E) described above with reference to the first embodiment of the present invention.

The impurity trap layer 24 can comprise a thin layer of a material such as silicon nitride, and the use of this layer provides some important advantages. One advantage is that of providing improved adhesion of patterned electrodes 12 to substrate 10, for a wide range of substrate materials. Another advantage is that the impurity trap layer serves to prevent impurities contained in the substrate material from diffusing into the semiconductor thin film 14, since such diffusion of impurities can cause deterioration of the performance of the thin film transistors. In addition, use of impurity trap layer 24 serves to provide improved surface qualities for formation of patterned electrodes 12, so that these electrodes can be formed with a higher degree of accuracy than is possible when the electrodes are formed directly on substrate 10.

Figure 3:
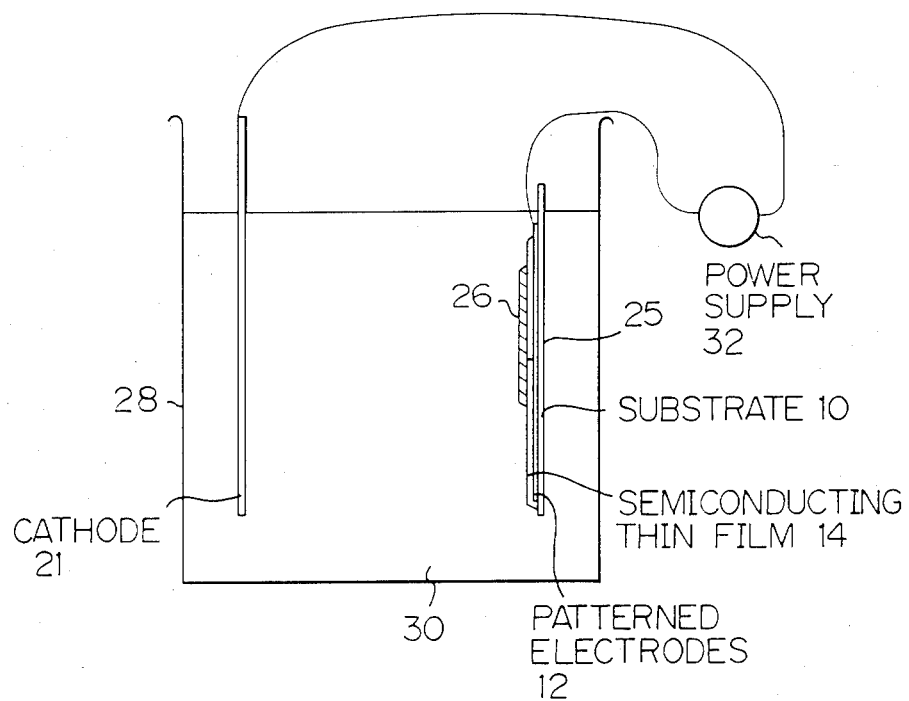
FIG. 3 is a simplified diagram for illustrating the general principles of an apparatus for performing anodic oxidation in the liquid phase.

Referring now to FIG. 3, a simplified diagram is shown for explaining the main features of an apparatus for performing anodic oxidation with the method of the present invention, in the liquid phase. An assembly 25 comprising substrate 10 with substrate and semiconductor thin film 14, formed as illustrated by steps 1(A) and 1(B) in the first embodiment for example, is immersed in an electrolyte 30 contained in a vessel 28. A cathode electrode 21 is positioned opposite the assembly 25, and a power supply 32 applied a suitable potential between cathode 21 and the patterned electrodes 12, which are connected in common to power supply 32 to thereby function as an anode electrode for the anodic oxidation process. A layer of insulating material 26 may be formed over certain parts of assembly 25 to define the area of anodic oxidation, to thereby ensure more even deposition of an oxide film by the anodic oxidation process. A suitable electrolyte can comprise a solution of potassium nitrate and hydrogen oxide in a solvent comprising N-methylacetamide or tetrahydrofurfury alcohol or ethyleneglycol.

It will be understood from the above that the method of the present invention enables anodic oxidation to form an oxide film on a semiconductor thin film to be carried out in a simple and convenient manner at low temperatures, with patterned electrodes which are subsequently used to form the source and drain electrodes of thin film transistors being utilized as an anode electrode in the anodic oxidation process, whereby an oxide film is produced which has a high degree of uniformity of thickness and excellent insulating properties and is therefore ideally suited for use as the gate insulating layer of thin film transistors. Since patterned electrodes 12 are eventually used to form the thin film transistor source and drain electrodes, it is not necessary to form a separate electrode in order to carry out anodic oxidation, so that the anodic oxidation process can be made extremely simple and economical. And since the production of the oxide film for use as the gate insulating layer of the thin film transistors is performed at low temperatures, it is possible to use inexpensive and easily available materials such as quartz glass or pyrex glass as the material of substrate 10. This substrate can therefore also be used as a display substrate of a display device (such as a liquid crystal display) having a large number of elements with high display density. The present invention can therefore make it practical and economical to produce high-density displays of matrix type in which thin film transistors manufactured according to the method of the present invention are used as matrix switching elements. Such thin film transistors display excellent switching characteristics, in addition to the ease of formation upon a substrate made of glass or other material, making them highly suited to such high density matrix display applications.

Figure 4:
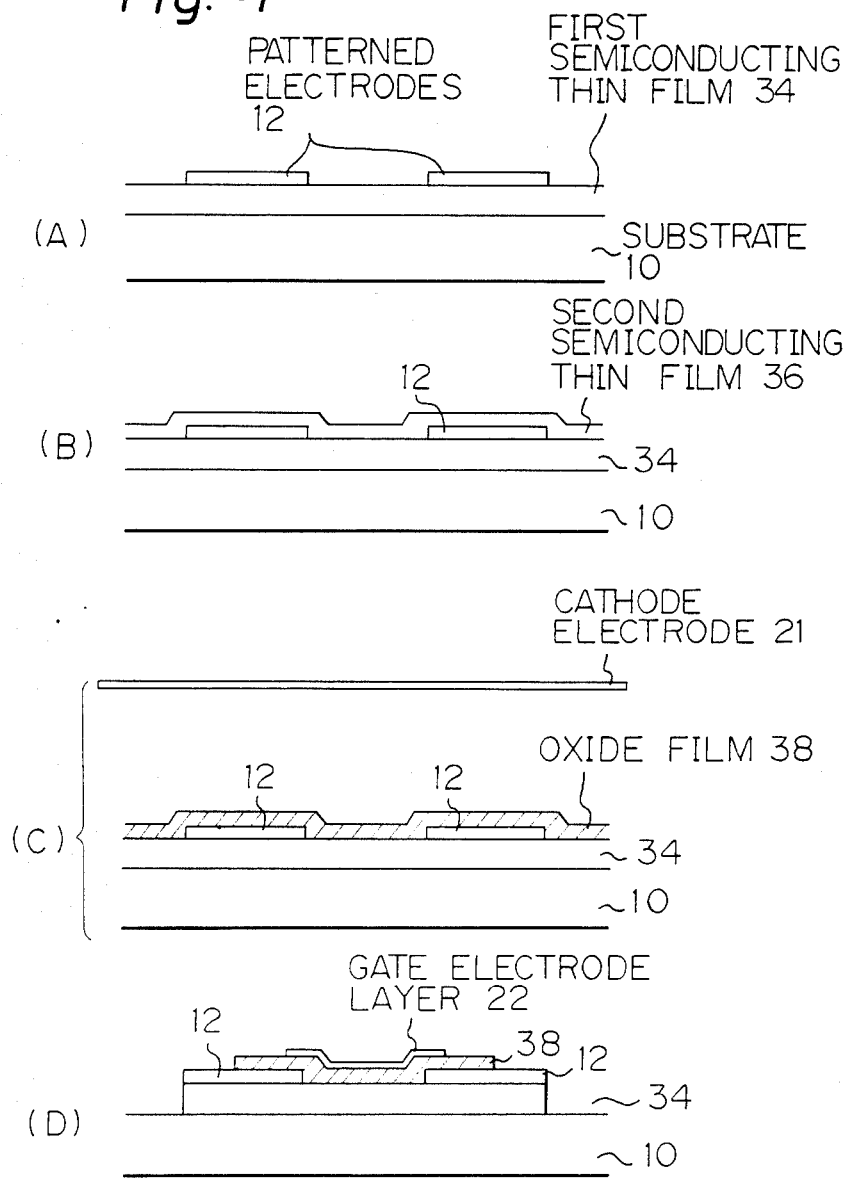

Referring now to FIG. 4, a third embodiment of a method of manufacturing thin film transistors according to the present invention will be described. In the step of FIG. 4(A), a first semiconductor thin film 34 is formed on a substrate 10, and patterned electrodes 12 are formed on this semiconductor thin film 34. In the step of FIG. 4(B), a thin film of a non-insulating material, which in this embodiment comprises a second semiconductor thin film 36, is formed over the first semiconductor thin film 34 and the patterned electrodes 12. The substrate can comprise a suitable type of glass, the first semiconductor thin film 34 can comprise a film of Si, while the second semiconductor thin film 36 can comprise a layer of silicon or some other material which is suited to the anodic oxidation process. The first and second semiconductor thin films 34 and 36 can be formed by a low temperature deposition process such as chemical vapor deposition (CVD) or by physical vapor deposition (PVD), and such a process can also be used to form semiconductor thin film 14 of the first two embodiments described above. The patterned electrodes 12 can be formed of a suitable metal such as Ta or Mo, and the cathode electrode 21 for anodic oxidation in the liquid phase can be of platinum.

In the initial part of the anodic oxidation process, portions of second semiconductor thin film 36 which are closest to the patterned electrodes 12 will first be converted into an oxide film 38, for the reasons described hereinabove with reference to FIG. 1(C). Eventually, as shown in the step of FIG. 4(C), the second semiconductor thin film 36 is converted into an oxide film 38 of highly uniform thickness. In the step of FIG. 4(D), a gate electrode layer is first formed over the oxide film 38, and then patterning is carried out, e.g. by etching, to remove unnecessary portions of gate electrode layer 22 and oxide film 38, to thereby form a thin film transistor, with portions of patterned electrodes 12 being formed to serve as source and drain electrodes, and with oxide film 38 serving as a gate insulating layer.

In the latter embodiment, a layer of a non-insulating material, such as a second semiconductor thin film, is formed over a first semiconductor thin film 34 and the patterned electrodes 12, and the layer of non-insulating material is converted into an oxide film by anodic oxidation, this oxide film serving thereafter as a gate insulating layer for thin film transistors. This method presents an advantage over the first two embodiments of the present invention described hereinabove, in that the non-insulating material can be selected to be suitable for oxidation by the anodic oxidation process to provide a high-quality oxide film, while the first semiconductor thin film 34 can be of material which is selected solely on the basis of its semiconductor properties, without regard for ease of oxidation by the anodic oxidation process.

Referring now to FIG. 5, a fourth embodiment of a method of manufacturing thin film transistors according to the present invention will be described. This differs from the embodiments described herinabove, in that the anode electrode used in the anodic oxidation process is also used as a mask for the anodic oxidation process, but in other respects is basically similar. In the first step, shown in FIG. 5(A), a semiconductor thin film 40 is formed on an insulating substrate 10. The semiconductor thin film 40 can comprise for example a film of polycrystalline silicon, formed by chemical vapor deposition. This semiconductor thin film is patterned to a suitable shape, and is then annealed by using a laser beam.

In the step of FIG. 5(B), a conducting film 42 is formed over the substrate 10 and over portions of semiconductor thin film 40, with a window aperture 43 being formed in conducting film 42 over a region of semiconductor thin film which will subsequently become the active region, i.e. the channel region, of the final thin film transistor. Aperture 43 can be formed in conducting film 42 by using photolithography, for example, and conducting film 42 can comprise a metallic layer formed by evaporative deposition.

In the step of FIG. 5(C), anodic oxidation of the region of semiconductor thin film 40 exposed within window aperture 43 is carried out, using the conducting film 42 as an anode, in conjunction with a cathode electrode 21 and a power supply 32. This anodic oxidation can be carried out in the gaseous phase or in the liquid phase, as described hereinabove for the previous embodiments. An oxide film 44 is thereby formed over the area of semiconductor thin film 40 within the window aperture 43, i.e. conducting film 42 serves as a mask for the anodic oxidation process. If the size of window aperture 43 is made sufficiently small, then since the conducting film 42 is in good electrical contact with semiconductor thin film 40 over a wide area, the oxide film 44 can be made extremely even and uniform. Evenness of the oxide film 44 can be further enhanced by forming conducting film 42 of an easily oxidisable metal, e.g. aluminum or tantalum. In this case, a layer of $Al_2O_3$ or $Ta_2O_5$ be initially formed over the conducting film 42, in the early stages of the anodic oxidation. However since this $Al_2O_3$ or $Ta_2O_5$ layer has a high electrical resistance, current will thereafter flow from conducting film 42 through semiconductor thin film 40 and hence through the window aperture region 43 of semiconductor thin film into the electrolyte or gaseous plasma. Thereafter, a uniform oxide film 44 (e.g. a film of $SiO_2$) will be formed.

In the step of FIG. 5(D), a gate electrode layer 46 is formed over oxide film 44. The conducting film 42 can then be patterned, e.g. by etching, to form the thin film transistors 48 and 50 of the thin film transistor. Alternatively, the source and drain electrodes can be formed from conducting film 42 when that film is deposited, i.e. in the stage of FIG. 5(B). An insulated gate thin film transistor is thereby formed, in which oxide film 44 constitutes the gate insulating layer.

The above embodiment of the present invention has the advantage that, since the conducting film 2 is used both as an anode electrode and also as a mask, in the anodic oxidation process, it is not necessary to perform patterning of the oxide film formed by the anodic oxidation process thereafter. The manufacturing process can thereby be somewhat simplified, since the difficulty of, for example, etching a film of $SiO_2$ is eliminated.

Figure 6:
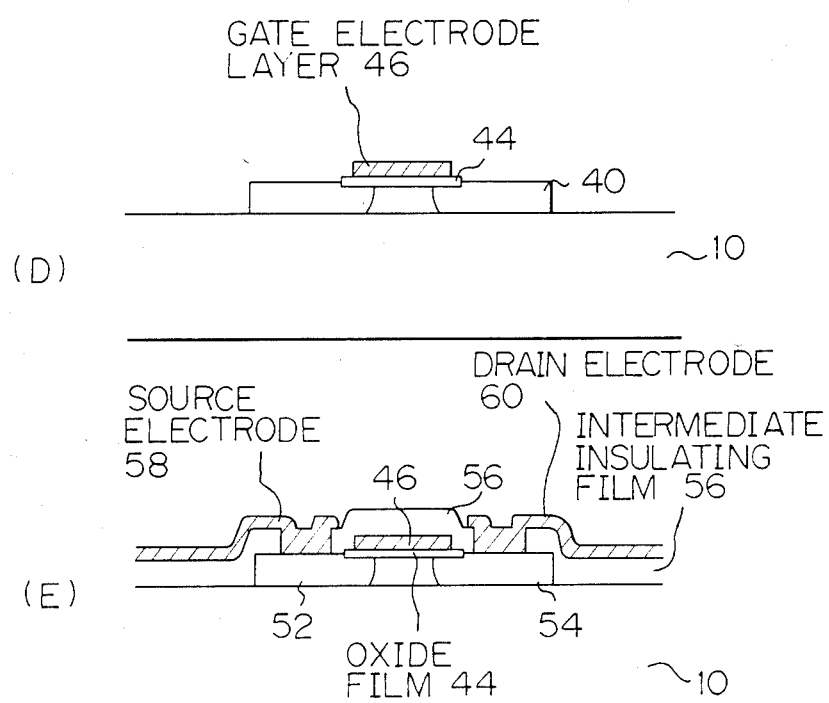

Referring now to FIG. 6, another embodiment of the present invention will be described. In the step of FIG. 6(A), a semiconductor thin film 40 is formed on an insulating substrate 10, as in the embodiment of FIG. 5, and shaped to a required pattern. However in this embodiment, doping of the source and drain regions 52 and 54 of the final thin film transistor is then carried, i.e. doping with a predetermined level of impurities. It should be noted that, although in this embodiment the doping of the source and drain regions is carried out as an initial step, it is also possible to perform this doping in some other stage of the manufacturing process.

In the step of FIG. 6(B), a conducting film 42 is formed over substrate 10 and semiconductor thin film 40, as in the previous embodiment, with a mask aperture 43 being formed therein, this conducting film 42 being arranged such as to overlap at least portions of the doped source and drain regions 52 and 54 of semiconductor thin film 40.

In the step of FIG. 6(C), anodic oxidation is carried out, using conducting film 42 as an anode as in the previous embodiment. An oxide film 44 is thereby formed over the channel region of the final thin film transistor.

In the step of FIG. 6(D), the conducting film 42 is completely removed, and a gate electrode layer 46 is formed over the oxide film.

In the step of FIG. 6(E), an intermediate insulating film 56 is formed over the gate electrode layer 46, and the exposed surface areas of semiconductor thin film 40, oxide film 44, and substrate 10. Patterning (e.g. by etching) of this intermediate insulating film is then carried out, to expose the source and drain regions 52 and 54 of semiconductor thin film 40. Source electrode 58 and drain electrode 60 are then formed in contact with source region 52 and drain region 54 respectively. The completed insulated gate thin film transistors has thus been formed, with oxide film 44, produced by the anodic oxidation process, constituting the gate insulating layer.

From the above description of the preferred embodiments, it will be apparent that the method of the present invention enables insulated gate thin film field effect transistors (referred to hereinabove simply as thin film transistors) to be manufactured in a simple and economical manner. It is a basic advantage of the method of the present invention that an oxide film which constitutes the gate insulating layer of the thin film transistors is formed at low temperatures, yet has an extremely high degree of uniformity of thickness and freedom from internal defects such as has hitherto been only obtainable by employing high temperature oxidation of a semiconductor film. If other methods of forming an insulating film for use as the gate insulating layer in thin film transistors is adopted, such as physical vapor deposition or chemical vapor deposition of a film of $Al_2O_3$, then the uniformity of thickness of the gate insulating layer thus produced is substantially inferior to that which can be obtained by the thermal oxidation process. Thus it is not possible to produce thin film transistors having good switching characteristics with such prior art methods of forming the gate insulating layer at low processing temperatures. However with the method of the present invention, a very high quality oxide film for use as a gate insulating layer is produced, whereby thin film transistors having excellent switching characteristics can be formed upon a substrate made of a material such as glass which has certain important advantages (e.g. low cost and transparency). Thus, the method of the present invention is extremely suitable for producing large numbers of thin film transistors upon a display panel substrate (for example, a transparent substrate of a liquid crystal display device) for use as matrix switching elements, whereby a display device having a high density of display elements can be easily and economically manufactured.

From the preceding description, it will be apparent that the objectives set forth for the present invention are effectively attained. Since various changes and modifications to the above construction can be made without departing from the spirit and scope of the present invention, it is intended that all matter contained in the above description or shown in the attached drawings shall be interpreted as illustrative, and not in a limiting sense. The appended claims are intended to cover all of the generic and specific features of the invention described above.

What is claimed is:

1. A method of manufacturing an insulated gate thin film field effect transistor, comprising the steps of:
    forming first and second closely adjacent anodic oxidation electrodes upon an electrically insulating substrate;
    forming a semiconducting layer on said insulating substrate and said first and second anodic oxidation electrodes;
    performing anodic oxidation of said semiconducting layer, utilizing said first and second anodic oxidation electrodes, to thereby form a layer of oxide on said semiconducting layer;
    shaping said oxide layer to form a gate insulator;
    shaping said semiconducting layer to expose a portion of each of said first and second anodic oxidation electrodes;
    patterning exposed portions of said first and second anodic oxidation electrodes to form source and drain electrodes, respectively; and
    forming an electrically conducting layer on said oxide layer of said semiconducting layer to form a gate electrode.

2. A method of manufacturing an insulated gate thin film field effect transistor according to claim 1, in which semiconductor layer comprises silicon.

3. A method of manufacturing an insulated gate thin film field effect transistor according to claim 2, in which said semiconducting layer comprises a layer of polycrystalline silicon.

4. A method of manufacturing an insulated gate thin film field effect transistor according to claim 3, in which said layer of polycrystalline silicon is formed by a chemical vapor deposition process.

* * * * *